United States Patent [19]

Miller

[11] 4,227,147
[45] Oct. 7, 1980

[54] ELECTROMECHANICAL PARAMETRIC AMPLIFIER FOR MEASUREMENT OF ELECTRIC FIELDS

[75] Inventor: Gabriel L. Miller, Westfield, N.J.

[73] Assignee: Bell Telephone Laboratories, Incorporated, Murray Hill, N.J.

[21] Appl. No.: 951,753

[22] Filed: Oct. 16, 1978

[51] Int. Cl.² ............................................. G01R 31/02
[52] U.S. Cl. ........................................ 324/72; 324/458
[58] Field of Search ..................... 324/32, 33, 72, 72.5

[56] References Cited
U.S. PATENT DOCUMENTS

| | | | |
|---|---|---|---|
| 3,344,344 | 9/1967 | Wales, Jr. | 324/32 |
| 3,370,225 | 2/1968 | Winder | 324/72; 324/458 |
| 3,522,531 | 8/1970 | Cohn | 324/32 |
| 4,055,798 | 10/1977 | Kato | 324/72 |

Primary Examiner—Michael J. Tokar
Attorney, Agent, or Firm—Allen N. Friedman; Peter V. D. Wilde

[57] ABSTRACT

The disclosed device is an electromechanical parametric amplifier. It utilizes, as the required nonlinear mixing element, the square law force of an electric field on the surface of a conductor. In an exemplary device, a wire grid (10) is placed adjacent to a conducting diaphragm (11). The diaphragm (11) is mechanically resonant at the local oscillator (LO) frequency. When a signal from the local oscillator (15) is applied to the grid (10), the diaphragm (11) experiences both the electrostatic force from the grid (10) and electrostatic force from the electric field to be measured. The amplitude of the vibration of the diaphragm (11) at the LO frequency is a measure of the electric field of interest. In an exemplary embodiment the vibration was measured by an electret microphone (12) and a lock-in amplifier (14). The measurement of electric field is important, for example, in industrial environments in which the buildup of static electricity is a problem.

12 Claims, 5 Drawing Figures

ELECTROMECHANICAL PARAMETRIC AMPLIFIER FOR MEASUREMENT OF ELECTRIC FIELDS

1. TECHNICAL FIELD

The invention is in the field of measuring instruments for the monitoring of electric field strength.

2. BACKGROUND OF THE INVENTION

The measurement of electric fields existing in open space is of importance for many industrial and meteorological purposes. One type of instrument which performs this function is known as a "generating voltmeter" or "field mill". In this type of instrument one metallic plate is alternately exposed and shielded from the field by a grounded metallic rotor. The resulting fluctuating charge on the stationary metallic plate flows to ground through a resistor thereby producing an electrical output signal that is related to the electric field being measured. A number of variants of this basic idea have been developed. For example, the required fluctuating shielding action can be effected with a suitably designed tuning fork mechanism to remove the need for a rotational drive for the grounded metallic rotor. Such schemes have depended basically on some periodic and relatively large scale mechanical motion to vary the coupling of the electric field of interest to a pickup electrode. As such they comprise field sensing devices that involve mechanical transducers, thereby limiting their usefulness for some applications where methods requiring no moving parts could possess significant advantages.

SUMMARY OF THE INVENTION

The novel instrument to be described and claimed below is an electromechanical parametric amplifier for the measurement of electric field strength. The device is essentially simple and rugged and is not required to contain parts which exhibit large scale mechanical motion. The disclosed device is an electromechanical parametric amplifier. It utilizes, as the required nonlinear mixing element the square law force of an electric field on the surface of a conductor. In the device an electrically transparent conducting partition (e.g. a wire grid) is placed adjacent to an electrically conducting broad member. The broad member is, preferably, mechanically resonant at the local oscillator (LO) frequency. When the LO signal is applied to the grid, the broad member experiences both the electrostatic force from the grid and electrostatic force from the electric field to be measured. The force of the combined fields produces vibration of the broad member. The amplitude of vibration at the LO frequency is a measure of the electric field of interest. In an exemplary embodiment the vibration was measured by an electret microphone and lock-in amplifier. The measurement of electric field is important in industrial environments in which the buildup of static electricity is a problem. Such environments include MOS production lines, surgical operating rooms and grain elevators.

DETAILED DESCRIPTION

The disclosed electromechanical parametric amplifier utilizes, for its required nonlinear phenomenon, the fact that the pressure exerted by an electric field on the surface of a conductor varies as the square of the electric field. Thus if the field to be measured and an internally generated oscillating field (i.e., a local oscillator, LO, signal) are both imposed on a conductor, then the pressure on the surface of the conductor can be represented by the following expression $$P = K(E_s + E_o \sin \omega t)^2$$
$$= K(E_s^2 + E_o^2 \sin^2 \omega t + 2E_s E_o \sin \omega t)$$

Here,

P is the pressure exerted on the surface of the conductor,

K is a proportionality constant, $E_s$ is the electric field to be measured, $E_o \sin \omega t$ is the local oscillator field strength and $\omega$ is the local oscillator frequency.

Figure 1:
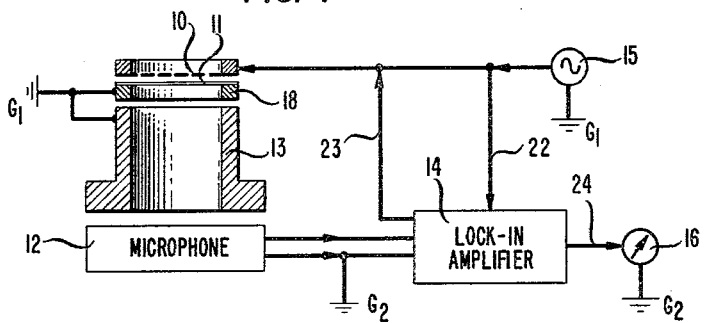
FIG. 1 is an elevational view in section, partially schematic, of an exemplary electromechanical parametric amplifier of the invention.

Since the leading term in the expansion of the $E_o^2 \sin^2 \omega t$ term is at a frequency of $2\omega$, the only pressure term at the frequency $\omega$ is linear in $E_s$. It is disclosed here that this fact can be used as the basis of the operation of a simple rugged apparatus for the measurement of electric field. An exemplary form of this instrument is illustrated in FIG. 1. In this instrument the local oscillator drive field and the field to be measured are both imposed upon a broad conducting member. This member is shown in the preferred form of a mechanically resonant metallic diaphragm 11 which is supported at the edges by a support member 18. The local oscillator signal, derived from the local oscillator 15, is applied to the diaphragm 11 by an adjacent electrically conducting partition 10. In order to reach the broad member, the electric field to be measured must, at least in part, penetrate the partition. That is to say the partition 10 must be transparent to the electric field. In an exemplary apparatus a wire grid was used as a transparent metal partition 10. In some situations a thin resistive film can be used. The diaphragm 11 is constructed so as to be mechanically resonant at the local oscillator frequency. Conversely the local oscillator frequency may be adjusted to be at the resonant frequency of the diaphragm 11. The use of a mechanically resonant broad member is preferred from a signal-to-noise viewpoint since one can take advantage of the mechanical Q to separate the signal due to the vibration at $\omega$ from the signal from the vibration at $2\omega$. The combination action of the field to be measured and the local oscillator then produces a vibration of the diaphragm. This vibration is linearly related (to first order) to the strength of the field being measured. Some means must then be provided to measure the amplitude of vibration of the diaphragm 11.

In the exemplary apparatus of FIG. 1 the vibration measurement is done by means of microphone 12. The output of the microphone is then fed into a lock-in amplifier. The lock-in amplifier is an amplifier which includes a phase sensitive detector which will take the microphone output and a reference phase signal 22 from the local oscillator 15 and produce a signal which is related to only that part of the microphone signal which is in a small band of frequency close to the frequency of the oscillator 15. The output of the lock-in amplifier 24 is related to the electric field being measured. This may be read out on a meter 16 or other information sensitive devices such as an analog-to-digital converter for direct computer processing of the electric field measurements.

In another mode of operation of such a device the lock-in amplifier includes servo circuitry which feeds back a signal 23 to the partition 10 at the frequency of the electric field being measured, the phase of this signal being such as to tend to reduce the microphone signal to zero (within the stability of the servo loop). The output signal 24 is then taken from the servo circuitry (e.g. as the magnitude of the voltage fed back to electrode 10).

Figure 2:
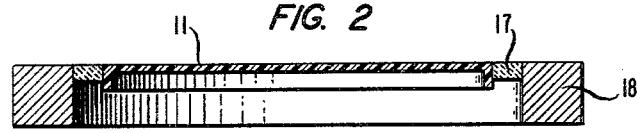
FIG. 2 is an elevational view in section of an exemplary broad member in the form of a resonant diaphragm with stress measuring elements.
Figure 3:
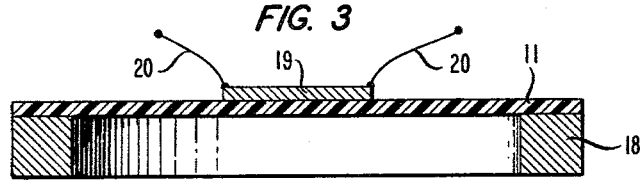
FIG. 3 is an elevational view in section of an exemplary diaphram with a strain measuring element.

The amplitude of the vibration of the diaphragm 11 is also measurable by means of stress sensitive or strain sensitive devices applied directly to the diaphragm 11. Such arrangements are illustrated in FIGS. 2 through 5. In FIG. 2 the diaphragm 11 is fixed at its outer edge to a ring 17 of stress sensitive material such as to piezoelectric ceramic. As the diaphragm 11 vibrates it stresses the piezoelectric ring 17 producing electrical output signal between the inner and outer edges of the ring 17. This signal is at a frequency $2\omega$. This double frequency output can be used to advantage in reducing crosstalk from the local oscillator. In FIG. 3 the output signal is read from leads 20 at the end of a strain gauge 19.

Figure 4:
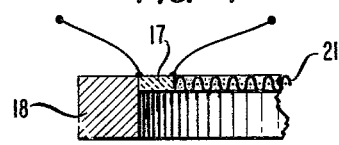
FIG. 4 is an elevational view in section of a portion of a resonant grid with a stress measuring element.
Figure 5:
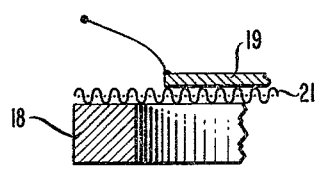
FIG. 5 is an elevational view in section of a portion of the resonant grid with a strain measuring element.

In order to reduce the sensitivity of the instrument to external acoustic vibration the mechanically resonant metallic diaphragm can be replaced by mechanically resonant metallic grid 21 (see FIGS. 4 and 5). In this case, the vibration of the grid is sensed by stress or strain sensitive devices such as the piezoelectric ring 17 of FIG. 4 or the strain gauge 19 of FIG. 5. The entire measuring device would then have the simple form of two closely spaced circular stretched metal grids allowing for many uses in difficult environments such as atmospheric electric field measurements or measurements in industrial plants.

In an exemplary apparatus which was constructed the metal partition was a mesh grid of 40 micrometer thick tungsten wires spaced apart on 1.2 millimeter centers. The resonant diaphragm was fabricated from a 20 micrometer thick sheet of ethelyne terephthalate (also known by the trade name MYLAR) stressed and cemented down to a 4 centimeter diameter glass ring. Both surfaces of the diaphragm were coated with a thin layer of vacuum evaporated gold. The resonant frequency of the mounted diaphragm was 1.2 kHz, its mechanical Q was 20, and the spacing between the grid and the diaphragm was approximately 160 micrometers. The motion of the diaphragm was detected by means of an electret microphone spaced 4.5 centimeters from the diaphragm. It was found advantageous to electrically separate the grid and resonator from the microphone in this instance, and to use the double grounding system ($G_1$ and $G_2$ as shown in FIG. 1) to avoid electrical crosstalk from the oscillator from entering the microphone and amplifier system. The RMS noise (with a 1 second averaging time and 30 volts RMS local oscillator drive) corresponded to an electric field uncertainty of approximately 10 volts per centimeter and was dominated by acoustic pickup of room noise in the electret microphone.

If the material of the diaphragm 11 is itself piezoelectric (such as the material poly(vinylfluoradine)), the vibrational output signal is then read directly across the vibrating sheet. While the preferred embodiment of the broad member is a resonant diaphragm, other geometries are contemplated for use as the conductor being vibrated by the applied electric forces. For example, a metal disc on a cantilever arm is such a nonresonant structure and a strip of compliant material stretched between two supports is such a resonant member which is not supported on all of its edges.

It is worth noting with regard to all designs of this general type that the maximum available signal energy is given by $$E_s = \frac{\beta Q_m^2 P^2 A^2}{2\lambda}$$

where $Q_m$ is the mechanical Q of the resonant diaphragm, A its area, $\lambda$ is its spring constant and P is the electrostatic pressure. The parameter $\beta$ represents that fraction of the mechanical signal energy that is available as electrical energy. This demonstrates that the parameter $\beta Q_m^2/\lambda$ should be maximized to achieve the highest signal to noise ratio, indicating the desirability of high Q, low mechanical stiffness, and good mechanical-electrical coupling.

Stretched metal grids actually represent something of a compromise in this connection since they cannot be expected to exhibit very high Q's. However, they are attractive in three other regards, namely in that they possess low stiffness and low atmospheric coupling and in addition can readily be arranged to exhibit $\sim 50\%$ electrical transparency (which is the optimum value).

One also notes that devices of this type are actually parametric amplifiers since all the energy used to vibrate the grid is derived from the local oscillator, while none is extracted from the signal field. As such they can be expected to exhibit very low ultimate noise performance since the parametric gain is itself nearly noise-free.

Simple estimates of signal to noise performance indicate that the ultimate sensitivity will not be limited by thermodynamic noise sources but rather by contact potential fluctuation between the metal grids. As such the smallest DC field that could reliably be measured would be of the order of the average contact potential fluctuation divided by the grid separation.

Another topic that is worthy of attention is that of the frequency response of such systems. Here one notes that the lock-in post-detection filter must in effect average over a large number of cycles of the diaphragm resonant frequency. A reasonable choice might be of the order of one hundred or so cycles, thereby leading to a frequency response extending from DC up to $\sim \omega_r/100$.

A final point relates to calibration and the overall gain stability of such E field measuring devices. Here it would cleary be advantageous to use the system in a closed servo loop by adding such a voltage to the outer grid as just to cancel the applied external electric field. Apart from the previously mentioned question of contact potentials, the calibration stability of the system would then only depend on the mechanical stability of the grid spacing.

I claim:

1. Apparatus for the measurement of an external electric field comprising
   (a) an electrically conducting partition, at least partially transparent to the external electric field;
   (b) a local oscillator electrically connected to the partition, for imposing an electrical drive signal on the partition at a drive frequency and for producing a phase reference signal;
   (c) an electrically conducting broad member whose edge is supported in a fixed position adjacent to the partition which said broad member is capacitively coupled to the partition and exposed to the external electric field whereby the broad member is so situated as to experience a drive signal electrical force from the partition and an external elecrical force;
   (d) pickup means for sensing the amplitude of the motion of the broad member at the drive frequency, which amplitude is directly related to the external electric field; and
   (e) an amplifier connected to the pickup means and the local oscillator for accepting the pickup means output signal and the phase reference signal and producing a measurement output signal related to the external electric field.

2. Apparatus of claim 1 in which the pickup means includes a microphone.

3. Apparatus of claim 2 in which the broad member is a diaphragm consisting essentially of a metallized polymer film.

4. Apparatus of claim 3 in which the polymer film consists essentially of ethelyne terephthalate.

5. Apparatus of claim 1 in which the pickup means includes stress sensing means for sensing the stress in the broad member.

6. Apparatus of claim 5 in which the stress sensing means consists essentially of at least one piezoelectric element.

7. Apparatus of claim 1 in which the pickup means includes strain sensing means for sensing the strain of the broad member.

8. Apparatus of claims 5 or 7 in which the diaphragm includes a metal wire mesh.

9. Apparatus of claim 1 in which the broad member is mechanically resonant at the drive frequency.

10. Apparatus of claim 1 in which the broad member is a diaphragm.

11. Apparatus of claim 10 in which the diaphragm is mechanically resonant at the drive frequency.

12. Apparatus of claim 1 in which the amplifier includes servo means for applying a servo signal to the metal partition of such magnitude and phase as to null the pickup means output signal.

* * * * *